(12) United States Patent
Basler et al.

(10) Patent No.: US 10,461,739 B2
(45) Date of Patent: Oct. 29, 2019

(54) TRANSISTOR DEVICE

(71) Applicant: Infineon Technologies Austria AG, Villach (AT)

(72) Inventors: Thomas Basler, Ottenhofen (DE); Roman Baburske, Otterfing (DE); Johannes Georg Laven, Taufkirchen (DE); Franz-Josef Niedernostheide, Hagen am Teutoburger Wald (DE); Hans-Joachim Schulze, Taufkirchen (DE)

(73) Assignee: Infineon Technologies Austria AG (AT)

( * ) Notice: Subject to any disclaimer, the term of this patent is extended or adjusted under 35 U.S.C. 154(b) by 0 days.

(21) Appl. No.: 15/921,878

(22) Filed: Mar. 15, 2018

(65) Prior Publication Data
US 2018/0269871 A1 Sep. 20, 2018

(30) Foreign Application Priority Data

Mar. 16, 2017 (DE) .................. 10 2017 105 712

(51) Int. Cl.
*H03K 17/567* (2006.01)
*H03K 17/12* (2006.01)
(Continued)

(52) U.S. Cl.
CPC ....... *H03K 17/567* (2013.01); *H01L 27/0635* (2013.01); *H01L 29/7393* (2013.01); *H01L 29/78* (2013.01); *H02H 3/08* (2013.01); *H03K 17/08* (2013.01); *H03K 17/0822* (2013.01); *H03K 17/0828* (2013.01);
(Continued)

(58) Field of Classification Search
CPC .............. H01L 27/0635; H01L 27/088; H01L 2924/13055; H01L 2924/13091; H03K 17/567; H03K 17/0822; H03K 17/08
See application file for complete search history.

(56) References Cited

U.S. PATENT DOCUMENTS 8,193,848 B2 * 6/2012 Zhang ................. H01L 21/8213
327/318
2012/0235710 A1 * 9/2012 Roessler .............. H03K 17/567
327/109
(Continued)

FOREIGN PATENT DOCUMENTS

DE 10 2014 226 475 B3 5/2016
EP 3 240 177 A1 1/2017

*Primary Examiner* — Julia Slutsker
(74) *Attorney, Agent, or Firm* — Design IP

(57) ABSTRACT

Transistor devices are provided. A transistor device includes a unipolar transistor coupled between a first terminal and a second terminal; and a bipolar transistor coupled in parallel to the unipolar transistor between the first terminal and the second terminal. The bipolar transistor is configured to carry a majority of a current flowing through the transistor device when at least one of the current or a control voltage controlling the unipolar transistor and the bipolar transistor exceeds a predetermined threshold. The bipolar transistor is further configured to have a threshold voltage higher than a threshold voltage of the unipolar transistor, and a difference between the threshold voltage of the bipolar transistor and the threshold voltage of the unipolar transistor is at least 1 V.

20 Claims, 6 Drawing Sheets

(51) Int. Cl.
*H03K 17/687* (2006.01)
*H01L 27/06* (2006.01)
*H01L 29/78* (2006.01)
*H02H 3/08* (2006.01)
*H01L 29/739* (2006.01)
*H03K 17/08* (2006.01)
*H03K 17/082* (2006.01)
*H01L 27/088* (2006.01)
*H01L 27/07* (2006.01)

(52) U.S. Cl.
CPC ......... *H03K 17/122* (2013.01); *H03K 17/127* (2013.01); *H03K 17/687* (2013.01); *H01L 27/0727* (2013.01); *H01L 27/088* (2013.01); *H01L 2924/10253* (2013.01); *H01L 2924/10272* (2013.01); *H01L 2924/13055* (2013.01); *H01L 2924/13091* (2013.01); *H03K 2217/0036* (2013.01)

(56) References Cited

U.S. PATENT DOCUMENTS

| | | | |
|---|---|---|---|
| 2013/0257177 A1* | 10/2013 | Jacobson | H02M 1/08 307/115 |
| 2014/0184303 A1* | 7/2014 | Hasegawa | H03K 17/12 327/377 |
| 2017/0019097 A1 | 1/2017 | Sato | |
| 2017/0047320 A1 | 2/2017 | Naito et al. | |
| 2017/0346478 A1 | 11/2017 | Steiner et al. | |
| 2018/0026030 A1* | 1/2018 | Sakai | H03K 17/0822 361/57 |
| 2018/0138904 A1* | 5/2018 | Nagase | H02M 1/08 |

* cited by examiner

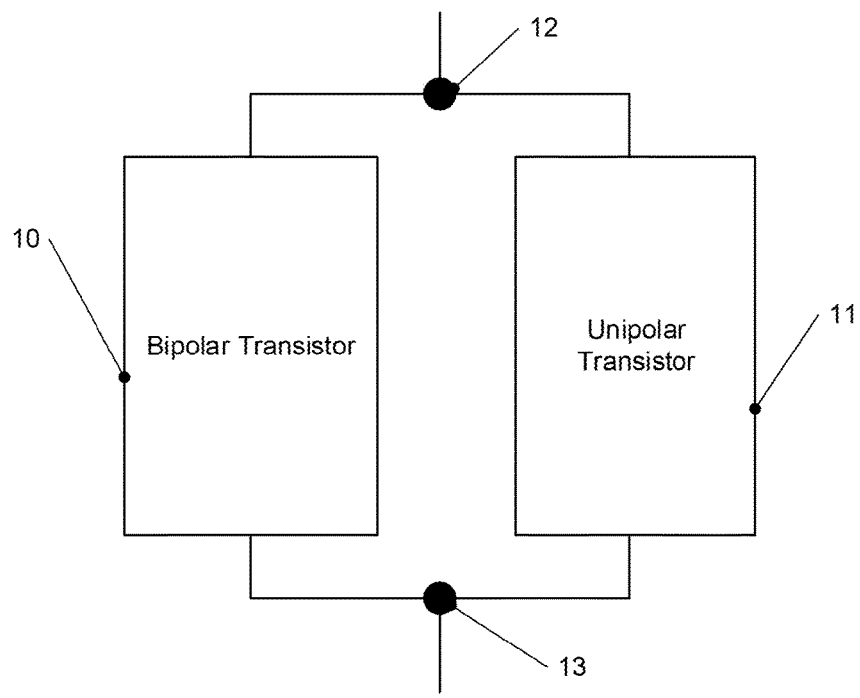
Fig. 1
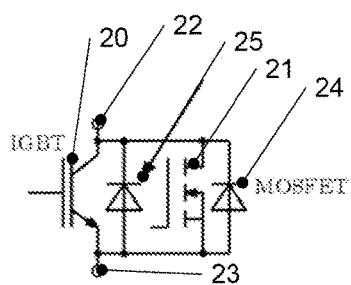 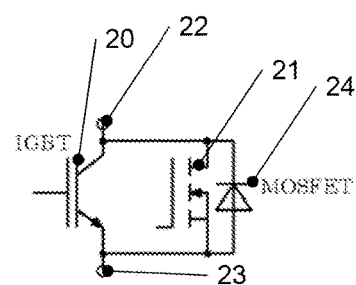 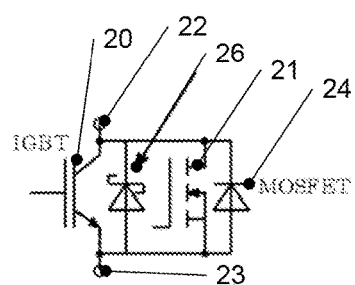
Fig. 2A         Fig. 2B         Fig. 2C ardon # TRANSISTOR DEVICE

FIELD

The present application relates to transistor devices.

BACKGROUND

In many applications, transistor devices are used. For example, transistor devices may be used as switches in electronic power applications. Various transistor types have been employed as switches, for example bipolar transistors like bipolar junction transistors (BJTs) or insulated gate bipolar transistors (IGBTs), or unipolar transistors like metal oxide semiconductor field effect transistors (MOSFETs). Such transistors and corresponding transistor devices including one or more transistors and possibly additional circuitry are available in different designs to support various voltages and/or currents.

Many electronic power applications operate under partial load over most of the time, and require operation under a maximum load (for example maximum current or power) only part of the time. An example for such an application are switched mode power supplies (SMPS), in which typically during about 80% of the operation time only 20% or less of a maximum power is needed. Nevertheless, such devices have to be configured to tolerate a maximum possible power to prevent failures. Also for higher voltage ranges, for example voltages above 1700 V, many applications exist which switch between full load and partial load, for example converters for solar or wind power plants or application in power trains of vehicles, where for starting of an engine full load is required, whereas, during normal driving only a part of the full power is needed.

Different transistor types may have different drawbacks and advantages when employed in such applications. For example, IGBTs are advantageous for high currents, but under partial load often suffer from a comparatively low efficiency. On the other hand, some unipolar transistor switches like MOSFETs may have a lower efficiency under full load and/or may require large chip areas. In particular, in case of overcurrents, bipolar transistors, in particular IGBTs, have better capabilities than MOSFETs.

It is therefore an object to provide transistor devices with improved handling of overcurrents, while still providing good capabilities under partial load, for example low currents.

SUMMARY

According to an embodiment, a transistor device is provided that includes a unipolar transistor coupled between a first terminal and a second terminal, and a bipolar transistor coupled in parallel to the unipolar transistor between the first and the second terminals, where the bipolar transistor is configured to carry a majority of a current flowing through the transistor device when at least one of the current or a control voltage controlling the unipolar transistor and the bipolar transistor exceeds a predetermined threshold.

According to another embodiment, a transistor device is provided that includes a unipolar transistor coupled between a first terminal and a second terminal, a bipolar transistor coupled in parallel to the unipolar transistor between the first and the second terminals, and gate control circuitry, where the control circuitry is configured to switch the bipolar transistor on only upon detection of an overcurrent event.

The above summary is merely intended to give a brief overview over some features of some embodiments and is not to be construed as limiting.

BRIEF DESCRIPTION OF THE DRAWINGS

FIG. 1 is a block diagram of a transistor device according to an embodiment.

FIGS. 2A to 2C are circuit diagrams illustrating transistor devices according to various embodiments.

DETAILED DESCRIPTION

Figure 3:
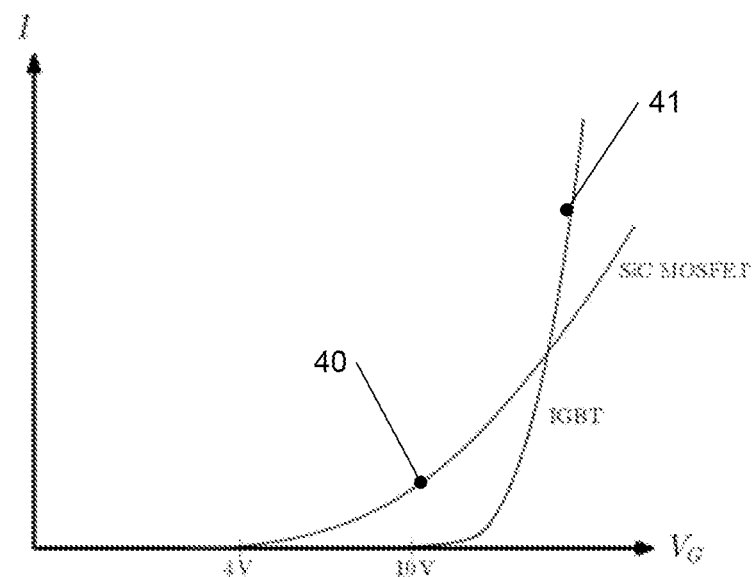
FIG. 3 is a diagram showing example characteristic curves of transistors included in transistor devices according to some embodiments.

In the following, various embodiments will be described referring to the attached drawings. It should be noted that these embodiments are given by way of example only and are not to be construed as limiting. For example, while embodiments may be described as comprising numerous features or elements, in other embodiments some of these features or elements may be omitted and/or may be replaced by alternative features or elements. Furthermore, in addition to the features and elements explicitly shown and described, further features or elements as known to persons skilled in the art may be provided.

Features or elements from different embodiments may be combined with each other to form further embodiments. Variations or modifications described with respect to one of the embodiments may also be applied to other embodiments.

In the embodiments discussed and described, any direct electrical connection or coupling between elements, i.e. connection or coupling without additional intervening elements, may also be implemented by an indirect connection or coupling, i.e. a connection or coupling comprising one or more additional intervening elements, and vice versa, as long as the general purpose and operation of the connection or coupling, for example to transmit a certain kind of signal or information or to provide a certain kind of control, is essentially maintained.

In the following, transistor devices will be described. Transistor devices as used herein include one or more transistors. A transistor may be a bipolar transistor (for example using n-doped and p-doped active regions for implementation) or a unipolar (using essentially either only n-type or only p-type active regions for implementation). Examples for bipolar transistors include insulated gate bipolar transistors (IGBTs) having a gate terminal as a control terminal and collector and emitter terminals, or a bipolar junction transistor (BJT) having a base terminal as a control terminal and also emitter and collector terminals. Examples for unipolar transistors include metal oxide semiconductor field effect transistors (MOSFETs) or junction field effect transistors (JFETs), which include a gate terminal as control terminal and source and drain terminals.

In some embodiments, a transistor device comprises a parallel circuit of a unipolar transistor and a bipolar transistor. The bipolar transistor in the embodiment is configured to have a higher threshold voltage than the unipolar transistor, for example a threshold voltage at least 1 V higher, at least 2 V higher, at least 3 V higher, at least 4 V higher or at least 5 V higher. Furthermore, the bipolar transistor may be configured to have a higher transconductance than the unipolar transistor. In this way, in some embodiments the bipolar transistor may be used to support high currents, in particular surge currents or other overcurrent, whereas for lower currents only the bipolar transistor may be active in some embodiments. An overcurrent, in this respect, is a current exceeding a threshold above normal operation currents. A surge current is an overcurrent which occurs on a comparatively short time scale, e.g., of the order of 10 ms.

Turning now to the Figures, FIG. 1 illustrates a schematic block diagram of a transistor device according to an embodiment.

The transistor device of FIG. 1 comprises a bipolar transistor 10 and a unipolar transistor 11 coupled in parallel between a first node 12 and a second node 13. "Coupled in parallel" in this case means that one of the emitter or collector terminals of bipolar transistor 10 is coupled to node 12, and the other one of collector or emitter terminal of bipolar transistor 10 is coupled to node 13. Likewise one of source or drain terminals of unipolar transistor 11 is coupled to node 12, and the other one of source or drain terminals of unipolar transistor 11 is coupled to second node 13. In some implementations, bipolar transistor 10 may be an insulated gate bipolar transistor (IGBT). In some implementations unipolar transistor 11 may be a metal oxide semiconductor field effect transistor (MOSFET). In some embodiments, unipolar transistor 11 may be a silicon carbide (SiC) based transistor.

In the embodiment of FIG. 1, bipolar transistor 10 has a higher threshold voltage than unipolar transistor 11, for example at 1 V higher, at least 2 V higher, at least 3 V higher, at least 4 V higher or at least 5 V higher. Furthermore, in some embodiments bipolar transistor 10 may have a higher transconductance than unipolar transistor 11.

The threshold voltage, in this respect, corresponds to a minimum voltage at the control terminal (for example gate terminal) with respect to a further terminal (source terminal or emitter terminal) that is needed to create a conducting path between the source and drain terminals or collector and emitter terminals.

Bipolar transistor 10 and unipolar transistor 11 may have a same voltage class, i.e. may be configured for operation in a same anode-to-cathode voltage range or up to a same voltage limit (for example up to 100 V, up to 500 V, up to 1400 V, up to 2000V, up to 3.5 kV, up to 5 kV, up to 6.5 kV or even up to 7 kV, just to give some examples).

In such an embodiment, bipolar transistor 10 may be used to carry high currents, for example surge currents, while for lower currents essentially only the unipolar transistor is used. This allows to use favorable properties of the bipolar transistor for higher currents compared to the unipolar transistor. This will be explained later in more detail referring to FIGS. 3 to 5.

Before these explanations, referring to FIGS. 2A to 2C some implementation examples for transistor devices according to embodiments will be discussed. In FIGS. 2A to 2C, the same or similar elements bear the same reference numerals and will not be described repeatedly in detail.

The devices of FIGS. 2A to 2C each include an insulated gate bipolar transistor 20 and a metal oxide semiconductor field effect transistor 21 coupled in parallel between a first node 22 and a second node 23. MOSFET 21 in embodiments may be a SiC MOSFET, and IGBT 20 may be a silicon (Si) based IGBT. A MOSFET 21 is provided with an integrated body diode 24.

In FIG. 2B, only IGBT 20 and MOSFET 21 together with integrated body diode 24 are illustrated. In the embodiment of FIG. 2A, additionally a silicon freewheeling diode 25 is provided coupled between nodes 22 and 23, and in the embodiment of FIG. 2C additionally a silicon carbide (SiC) Schottky diode 26 is provided between nodes 22 and 23. Therefore, as can be seen, freewheeling diodes or other circuit elements like Schottky diodes may be provided in addition to IGBT 20 and MOSFET 21.

It should be noted that the embodiments of FIGS. 2A and 2C may be combined, i.e. a silicon freewheeling diode and a silicon carbide Schottky diode may both be provided. Such diodes may serve to reduce oscillations when switching the transistor device in some embodiments.

In some embodiments, for high voltage application peripheral regions of the bipolar transistor (for example IGBT) may be configured to be protected during current commuting processes. In particular, a reduced emitter efficiency in a peripheral region of an IGBT chip may be provided by a reduced emitter doping or an increased field stop doping compared to a central region.

It should be noted that the IGBT may also be an SiC-based IGBT.

In some embodiments, the IGBT may be a reverse conducting IGBT, i.e. include an integrated freewheeling diode, in particular a so-called reverse conducting diode controlled (RCDC) IGBT. In such RCDC IGBTs, characteristics may be controlled via the gate terminal of the RCDC IGBT also when the RCDC IGBT is in a diode mode (i.e. conducts current essentially via the diode). In some embodiments, such a reverse conducting (RC) IGBT may be not controllable. In such a case, the RC IGBT may be operated both in forward bias mode and freewheeling diode mode as a bipolar device and the unipolar transistor may be operated as a unipolar device in both modes. In such embodiments, control of the transistor device may be simplified.

In some embodiments, the bipolar transistor (e.g., IGBT) and/or the unipolar transistor (e.g., MOSFET) may be compensation devices, i.e. may include regions where e.g., an n-doping is compensated by regions of (e.g., columns of) p-doping or vice versa. As an example, the unipolar transistor may be a superjunction MOSFET.

Next, properties of unipolar and bipolar transistors in embodiments will be described referring to FIGS. 3 to 5, using a silicon carbide MOSFET as an example for a unipolar transistor and an insulated gate bipolar transistor (IGBT) as an example for a bipolar transistor. The explanation will be made using example characteristic curves, which serve illustration purposes only and are not to be construed as limiting.

In FIG. 3, a curve 40 shows an example current I (drain source current) for a SiC MOSFET versus gate voltage $V_G$, and a curve 41 illustrates an example current (collector emitter current) for an IGBT versus gate voltage $V_G$. As can be seen, the SiC MOSFET in the embodiment illustrated has a lower threshold voltage than the IGBT. For example, the threshold voltage of the unipolar transistor may be about 6V below the threshold voltage of the bipolar transistor in the example shown. Furthermore, the slopes of the curves, i.e. the transconductances, vary between curve 40 and curve 41. For example, the slope may be around 15 to 20 S (Siemens) for the SiC MOSFET (curve 40) and about 50 S for the IGBT (curve 41), such that the current rises faster for the IGBT with rising gate voltage once the threshold voltage has been reached. This means that high currents at high gate voltages are mostly supported by the IGBT, while lower currents are supported by the SiC MOSFET. As IGBTs tend to be more efficient for higher currents than for lower currents, this may increase overall efficiency of the transistor device and prevent the problems described initially for SiC MOSFETs at high currents in some embodiments.

In other words the IGBT is used as a kind of "booster" at high gate voltages, while for lower gate voltages (below the threshold voltage of the IGBT) primarily the unipolar transistor is used.

As mentioned, while having the properties discussed above, both unipolar and bipolar transistors may have approximately the same nominal voltage (voltage class), which in some embodiments enables a small chip size. The nominal voltage may correspond to a voltage the transistors are actually intended or approved to be used.

As the temperature dependence of the blocking voltage of IGBTs and in some transistor implementations may be different from each other, in some embodiments the IGBT has a higher blocking voltage at room temperature which can be for example more than 50 V higher or even more than 100 V higher than the breakdown voltage of the MOSFET at room temperature. In such embodiments the blocking voltage of the IGBT and the breakdown voltage of the MOSFET can be about the same at an operation temperature of the transistor device, which may be e.g., 120° C. or even 150° C. or more depending on the application. In this respect, the blocking voltage is a voltage below (avalanche) breakdown. A nominal blocking voltage of a device like a transistor indicates a maximum voltage for which no breakdown occurs as specified and/or guaranteed be a manufacturer. The breakdown voltage is the voltage where the actual breakdown occurs, usually specified at some predetermined breakdown current like 1 mA.

This will now be explained further referring to FIG. 4. FIG. 4 similar to FIG. 3 illustrates an example current I (drain source current) over gate voltage for a silicon carbide MOSFET (curve 50) and an IGBT (curve 51), where the IGBT has a higher threshold voltage (for example about 10 V) than the SiC MOSFET (for example about 4 V), and the IGBT has a higher transconductance than the SiC MOSFET. This means that for lower gate voltages below 10V in an area 52 in the example of FIG. 4, the IGBT is essentially non-conducting, and the silicon carbide MOSFET will take over the current. In this area, in particular no short circuit robustness of the IGBT is necessary, although the IGBT may be designed to withstand such short circuit currents for example between 12 V and 10 V in the example of FIG. 4, to provide short circuit robustness up to 12 V in the example of FIG. 4.

On the other hand, the IGBT may be designed to withstand typical surge currents, in particular surge currents having smaller time transients for example about 100 μs or more, 1 ms or more or 10 ms or more (but still significantly higher time constants that in case of short circuits, where time constants of a few μs may occur) which may occur in some applications. This leads to a capability to withstand surge currents in particular in an area labelled 53 in FIG. 4, where the IGBT takes over most of or nearly all of the current. Based on the time constants mentioned above, a device like a driver driving IGBT and MOSFET may be configured to distinguish between surge currents and short circuits, e.g., by measuring the slope of the current, and activate the IGBT only in case of a surge current.

Figure 4:
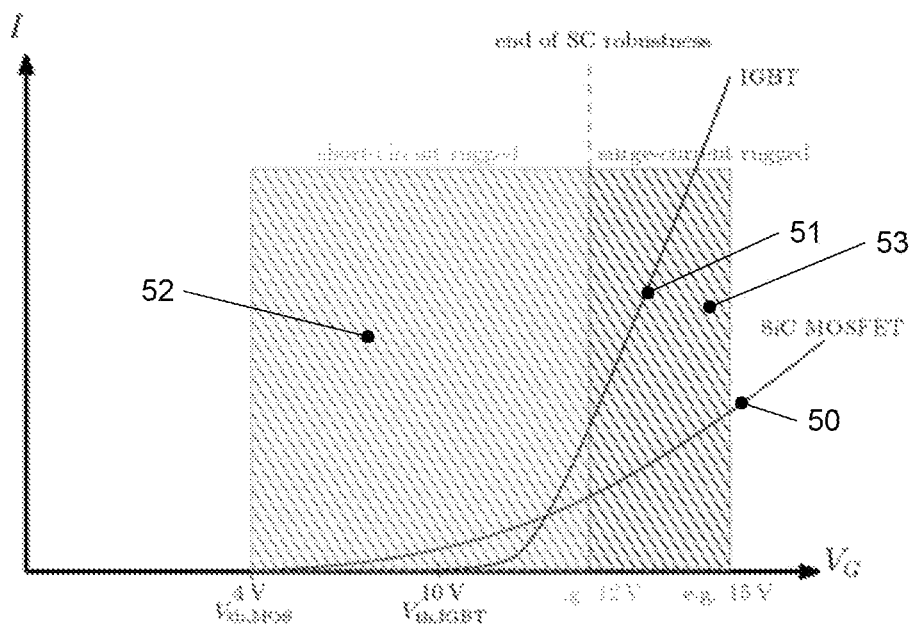
FIG. 4 is a diagram illustrating example characteristic curves further.

As typical silicon carbide MOSFETs have comparatively low voltage thresholds and IGBTs may be configured to have higher voltage thresholds, a threshold relationship as shown in FIG. 4 may be obtained by corresponding device design. Examples for the design of IGBTs having high threshold voltages will be explained later referring to FIGS. 9 to 11.

Such an IGBT may have a high transconductance, which in embodiments may be adjusted by a high channel width and/or a short channel length, which leads to the comparatively high transconductance of the IGBT compared to the silicon carbide MOSFET in the example of FIGS. 3 and 4. In particular, the IGBT may be designed for a broad dynamic range (i.e. a wide range of currents) as shown in FIG. 4.

In some implementations, the IGBT may be implemented with locally highly p-doped regions at a backside thereof to implement a high p-emitter esp. at higher currents. Depending on the lateral dimensions of these highly p-doped regions this can result in an improved softness during turn-off or an improved short-circuit ruggedness in some embodiments. In other embodiments, a doping at peripheral regions at the backside may be reduced, which may help to improve surge current behavior. Furthermore, in some embodiments highly p doped stripes may be provided at the backside, also to improve surge current behavior in some embodiments.

It should be noted that besides controlling the IGBT via the threshold voltage to switch on later (at higher voltages and for higher currents) than the SiC MOSFET, in other embodiments also an active gate control controlling the IGBT to be in an on-state only when higher currents are required may be provided, as will be explained further below.

Figure 5:
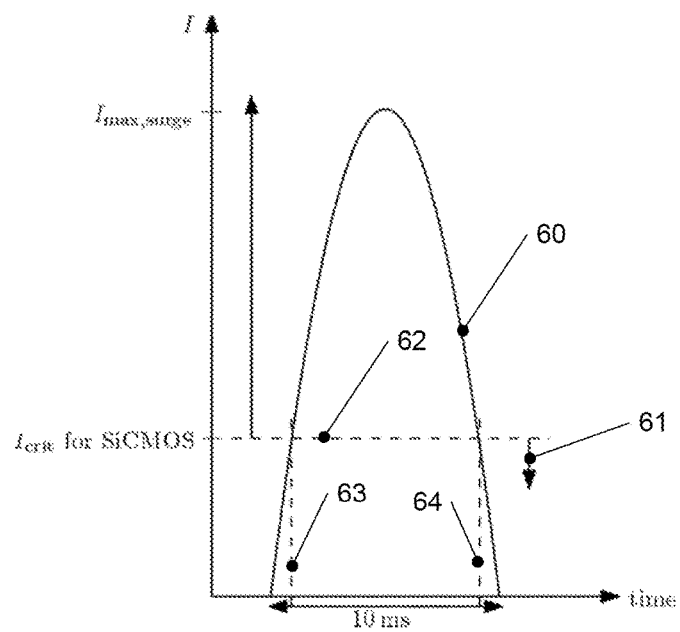
FIG. 5 is a diagram illustrating a surge current event.

FIG. 5 illustrates a surge current behavior of transistor devices according to some embodiments, where a current I is shown over time. A curve 60 schematically illustrates a surge current event, where a current reaches a maximum current $I_{max,surge}$. A line 62 indicates a critical current for a unipolar transistor like a SiC MOS, i.e. a current where adverse effects in the unipolar transistor as already discussed may occur, e.g., destruction of the transistor. As indicated by a dashed line 63, as soon as the surge current reaches the critical limit (or sooner), the bipolar transistor, for example IGBT, is switched on, for example by increasing the gate voltage accordingly, such that the bipolar transistor then carries most of the current, for example up to 80% of the maximum current $I_{max,surge}$. After the surge current event, as indicated at a dashed line 64, and an arrow 61, the gate voltage may be decreased again, thus turning the bipolar transistor off.

Figure 6A:
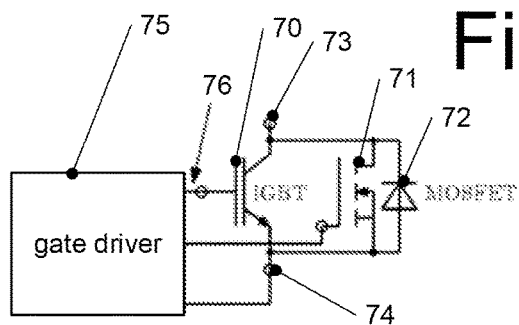
FIGS. 6A and 6B are diagrams illustrating controlling transistor devices according to embodiments.
Figure 6B:
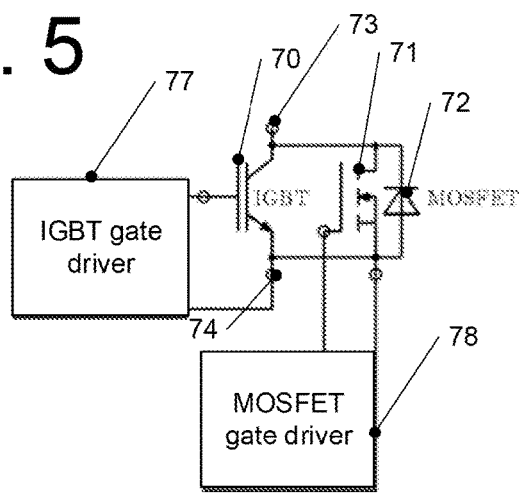

Surge events like the one shown in FIG. 5 have typical durations, for example about 10 ms (or 1 ms or 100 ms), and may be detected based on this temporal behavior and the current slopes associated therewith. In some embodiments, upon detection of the surge current the gate voltage may be increased to turn the bipolar transistor on, and/or the bipolar transistor may be turned on by a dedicated gate driver. These different possibilities for controlling will now be explained referring to FIGS. 6A and 6B. In FIGS. 6A and 6B, in order to avoid repetitions, similar elements bear the same reference numerals and will not be discussed twice.

The embodiments of FIGS. 6A and 6B each comprise an IGBT 70 as an example for a bipolar transistor and a MOSFET 71 including a diode 72 as an example for a unipolar transistor coupled in parallel between nodes 73, 74. In the embodiment of FIG. 6A, a single gate driver 75 is provided to control both IGBT 70 and MOSFET 71. Gate driver 75, as indicated by an arrow 76, may comprise a boost stage for providing a high gate voltage to also switch IGBT 70 on. This boost stage may be implemented in a comparatively simple manner, as it is only needed for surge events. Gate driver 75 may then switch on IGBT 70 by increasing ("boosting") the gate voltage upon detection of an overcurrent event like a surge current event.

FIG. 6B illustrates an implementation with separate drivers, where an IGBT gate driver 77 controls IGBT 70 and a MOSFET gate driver 78 controls MOSFET 71. In this implementation, IGBT gate driver 77 switches IGBT 70 on in case of an overcurrent event like a surge current event being detected. IGBT gate driver 77 may be implemented using a comparatively simple design, as it only has to be able to switch IGBT 70 on in case of surge current events. In other words, gate driver 77 need not be optimized to be able to turn the IGBT on or off during fast periodic switching or similar applications.

The gate drivers discussed in FIGS. 6A and 6B may also be configured to switch off IGBT 70 and MOSFET 71 in a stepwise manner, by first switching off IGBT 70 and then MOSFET 71. Using characteristics of FIG. 4 as an example, when both transistors 70, 71 are switched on using a gate voltage of e.g., 15V, the gate voltage may first be reduced to about 10V to switch IGBT 70 off, then remain at 10V for some predetermined time, and then reduced e.g., to 0V or below to also switch MOSFET 71 off.

Embodiments discussed above may be used for all applications where overcurrent/surge current needs to be handled, for example inrush current which occurs when turning some light bulbs on, motor driving or transformers. Such high current conditions may in particular occur in application where high load variations exist. In some implementations, the embodiments described may improve surge current protection.

Figure 7:
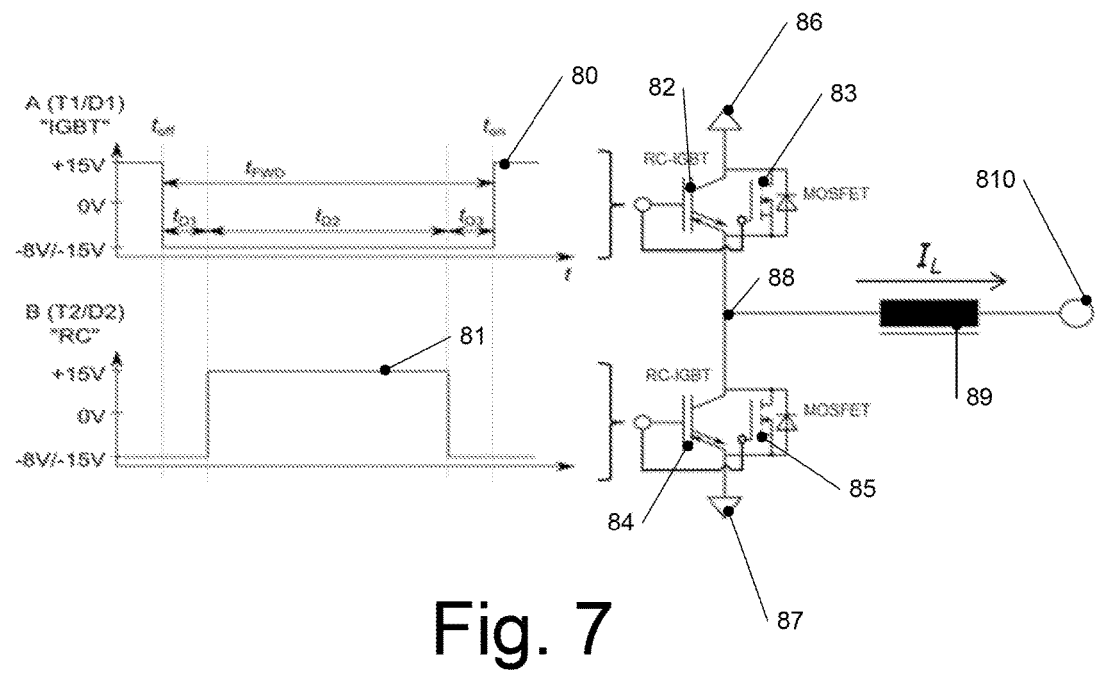
FIG. 7 illustrates an example for controlling transistor devices according to an embodiment.

FIG. 7 illustrates an example for controlling transistor devices according to embodiments. In FIG. 7, a first transistor device comprising an RC-IGBT 82 and a MOSFET 83 is coupled between a first terminal 86, for example a terminal to receive a positive supply voltage, and a node 88. A second transistor device comprising an RC-IGBT 84 and a MOSFET 85 is coupled between node 88 and a second terminal 87, which may for example adapt to receive a negative supply voltage or be coupled to ground. The first and second transistor devices may be implemented as discussed previously. In this way, in the example of FIG. 7 the first transistor device acts a high side switch, and the second transistor device acts a low side switch. RC-IGBT 82 and MOSFET 83 are for example controlled by a signal 80, and a RC-IGBT 84 and MOSFET 85 are controlled by a signal 81, to alternatingly open and close the first transistor device and the second transistor device, to alternatingly couple a load 89 and node 88 to terminal 86 or terminal 87. In the example control signals 80, 81 shown there is a time $t_{d1}$, $t_{d3}$ where both transistor devices are open (off) to prevent a short circuit between terminals 86, 87 when switching. The control scheme illustrated in FIG. 8 and signals 80, 81 serve merely as examples.

Figures 8A, 8B:
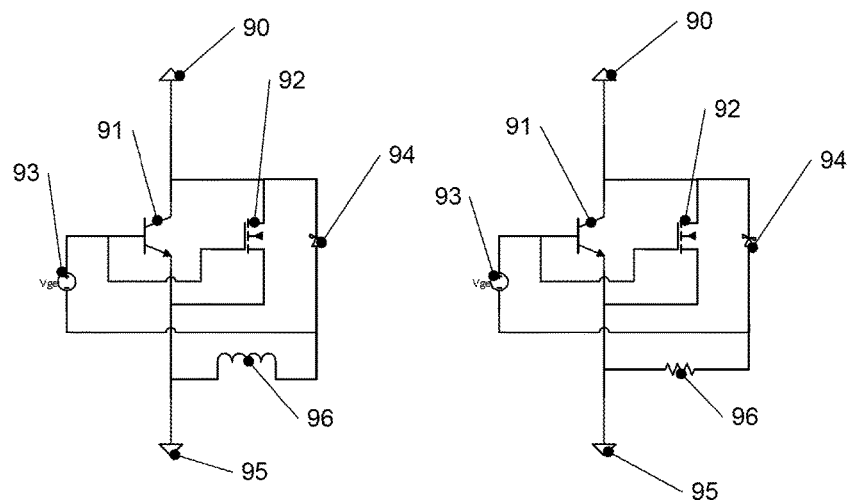
FIGS. 8A and 8B are circuit diagrams showing transistor devices according to some embodiments.

FIGS. 8A and 8B illustrate transistor devices according to further embodiments, including an additional inductive (FIG. 8A) or resistive (8B) gate coupling in a transistor device. The embodiments of FIGS. 8A and 8B each comprise a bipolar transistor 91, for example an IGBT, and a unipolar transistor 92, for example MOSFET (e.g., SiC MOSFET), coupled between a first terminal 90 and a second terminal 95. A control voltage (gate emitter/gate source voltage) Vge generated by a driver 93 controls transistors 91, 92. In FIG. 8A, an additional coupling is provided via an SiC diode 94 (e.g., a merged pin Schottky (MPS) SiC diode) and an inductivity 96 (which may for example be realized by bond wires), and in FIG. 8B an additional coupling is realized via SiC diode 94 and a resistor and/or inductor 96. Diode 94 in case of an overvoltage event goes into avalanche breakdown. Therefore, in such an event current is flowing through resistor/inductor 96. By appropriate dimensioning, in this case bipolar transistor 91 may at least partially close to conduct part of the current. Appropriate dimensioning in this case may include designing diode 94 with a lower breakdown voltage than bipolar transistor 91 and unipolar transistor 92. Otherwise, the considerations for the design of transistors 91, 92 for example with respect to threshold voltages discussed referring to FIGS. 1-7, are also applicable to FIGS. 8A and 8B.

Figure 9:
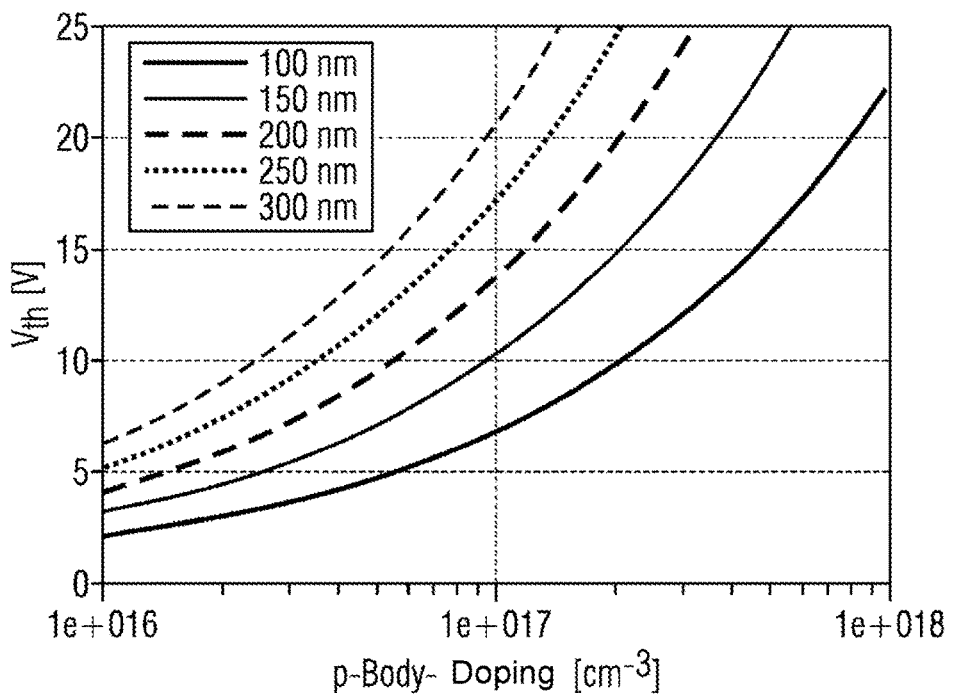
FIG. 9 is a diagram illustrating a threshold voltage of an IGBT usable in some embodiments.

Next, an example implementation of an IGBT usable in some embodiments will be discussed referring to FIGS. 9 to 11. In particular, referring to FIGS. 9 to 11 an IGBT which may be designed for a high threshold voltage will be discussed, so the threshold voltage of the IGBT may be made greater than the threshold voltage of a unipolar transistor like a SiC MOSFET, as discussed previously.

In some embodiments, a threshold voltage may be influenced by a dopant concentration in a body region of the IGBT or a thickness of a gate isolation layer (for example oxide layer). FIG. 9 illustrates an example threshold voltage Vth versus p-type body doping of a body region for varying oxide thicknesses of a gate oxide, the different curves referring to different thicknesses. The curves of FIG. 9 may for example be applicable to an IGBT for voltages of about 4.5 kV.

As can be seen from FIG. 9 the threshold voltage may be varied by varying the dopant concentration of a body region, as will be explained later for a body region 312, and/or by varying a gate oxide thickness. In some embodiments cells having different threshold voltages may be provided.

FIGS. 10A to 10D illustrate cells of an example IGBT, the IGBT comprising a plurality of cells. In the example of FIG. 10, cells 101a, 101b are provided which each may be configured for a desired threshold voltage, for example using the information from the curves from FIG. 9. Cells 101a, 101b are trench-type cells. The example IGBT of FIGS. 10A to 10B further comprises inactive cells 101c. Inactive cells 101c may be provided between cell 101a and cell 101b. Cells 101a, 101b may have a same threshold voltage or different threshold voltages. In particular, cell 101b may have a higher threshold voltage than cell 101a.

Figure 10A:
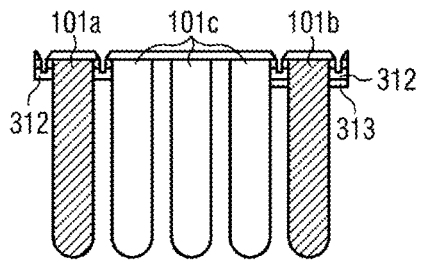
FIGS. 10A to 10D illustrate switchable cells of an insulated gate bipolar transistor according to some embodiments.

In the implementation of FIG. 10A, body region 312 of cell 101b comprises a p-doped body region 313, which has a higher doping concentration as the remaining body region 312. In other embodiments, also the body region of cell 101a may include such a p-doped body region 313. In this case, parts of p-typed body region 313 associated with cell 101b may be the same doping concentration or different doping concentration as the corresponding p-typed body region 313 associated with cell 101a. As explained with reference to FIG. 9 by adjusting the dopant concentration a threshold voltage may be adjusted. In some embodiments, p-typed body region 313 may be provided between the remaining body region 312 and a drift region.

Figure 10B:
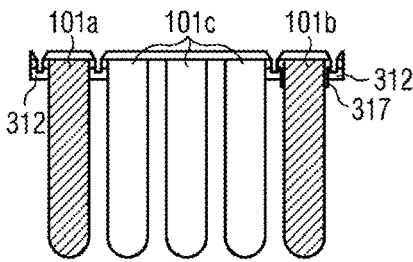
Figure 10C:
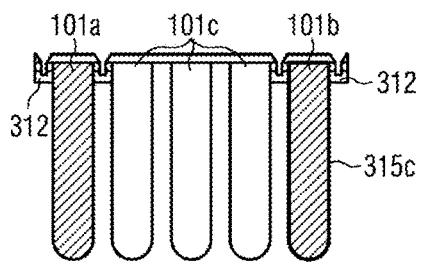
Figure 10D:
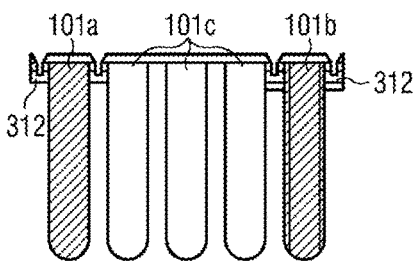

In the implementation of FIG. 10B, each body region comprises a channel region 317, wherein channel regions 317 associated with cell 101b may have a same or different dopant concentration than channel regions associated with cell 101a. In some embodiments as illustrated in FIG. 10C, a thickness of a gate isolation layer 315C may be adjusted to provide a threshold voltage. In some embodiments, as illustrated in FIG. 10D, floating gate structures may be used. In FIG. 10D, inactive cells 101c may have a high-ohmic connection, e.g., >1000 Ohm, to a source terminal, while in the embodiments of FIGS. 10A-10C inactive cells may have a lower ohmic connection, e.g., <100 Ohm, to the source terminal. The variations shown in FIGS. 10A to 10D may be combined with each other or used separately to adjust a threshold voltage as desired.

Figure 11A:
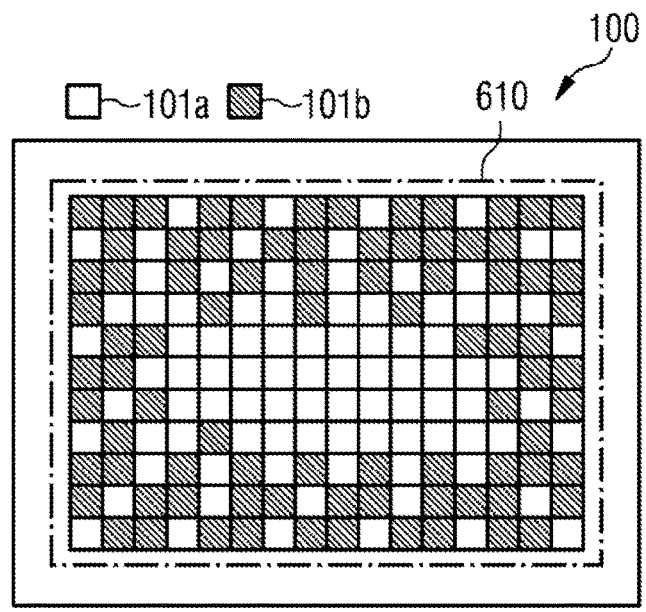
FIGS. 11A and 11B illustrate plan views of an insulated gate bipolar transistor usable in some embodiments.
Figure 11B:
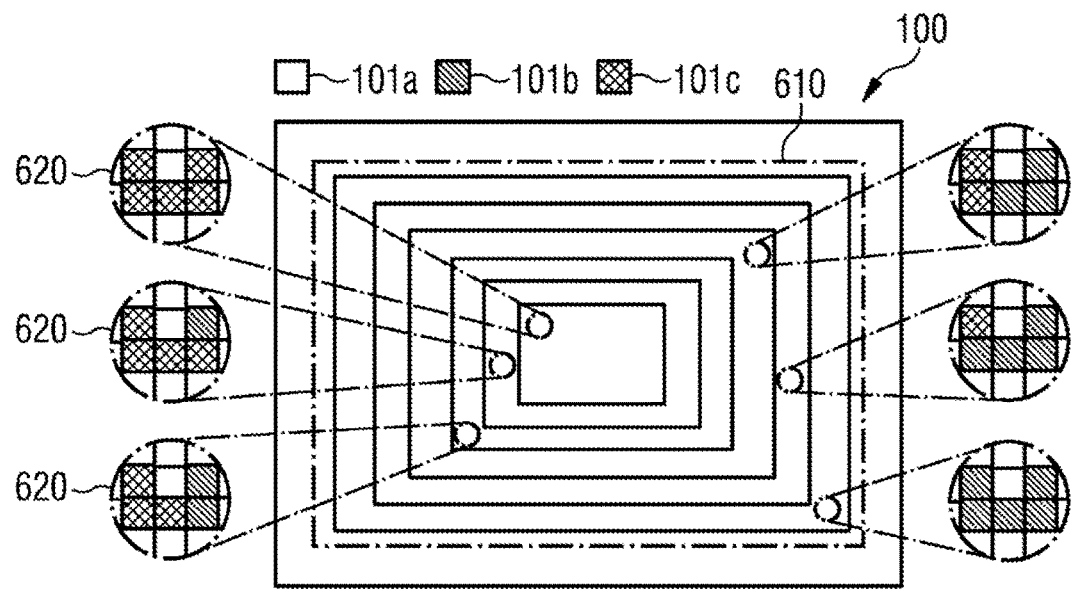

FIGS. 11A and 11B illustrate example plan views of IGBTs 100 according to some embodiments. The device 100 of FIGS. 11A and 11B has a peripheral border 610. Furthermore, the embodiment of FIG. 11A has cells 101a, 101b as described referring to FIGS. 10A to 10D distributed such that more cells 101b are close to peripheral border 610. In such an embodiment, cells 101b may have a higher threshold voltage than cells 101a. A reduced carrier density in normal operation may be provided at or near peripheral border 610. FIG. 11B illustrates a variation to FIG. 11A where additional inactive cells 101c are provided.

In various areas closer to or more spaced apart from peripheral border 610, different elementary cells 620 may be used to form device 100 of FIG. 11B. FIGS. 9 to 11 illustrate only examples how IGBTs having a high threshold voltage may be implemented and are not to be construed as limiting.

It should be noted that in a similar manner as shown in FIGS. 11A and 11B, IGBT and MOSFET may be integrated in a single device, where SI-IGBT cells are arranged corresponding to cells 101a and Si-MOSFET cells correspond to cells 101b. In such an implementation, the Si MOSFET cells may have a higher n dopant concentration in a drif region. Alternatively, unipolar and bipolar transistors like Si-IGBT and SiC-MOSFET may be bonded on a same substrate.

Further, in some embodiments, the bipolar transistor (e.g., IGBT) and/or the unipolar transistor (e.g., MOSFET) may be implemented as compensation devices, i.e. may include regions where e.g., an n-doping is compensated by regions of (e.g., columns of) p-doping or vice versa. As an example, the unipolar transistor may be a superjunction MOSFET.

The following embodiments are example embodiments.

Example 1

A transistor device includes a unipolar transistor coupled between a first terminal and a second terminal, and a bipolar transistor coupled in parallel to the unipolar transistor between the first and second terminals, where the bipolar transistor is configured to carry a majority of a current flowing through the transistor device when at least one of the current or a control voltage controlling the unipolar transistor and the bipolar transistor exceeds a predetermined threshold.

Example 2

The transistor device of example 1, where the bipolar transistor is configured to have a higher threshold voltage than the unipolar transistor, wherein a difference between the threshold voltage of the bipolar transistor and the threshold voltage of the unipolar transistor is at least 1 V.

Example 3

The device of example 2, where the difference is at least 3 V.

Example 4

The device of example 3, where the difference is at least 5 V.

Example 5

The device of example 1, where the unipolar transistor has a same nominal voltage as the bipolar transistor.

Example 6

The device of example 1, where the bipolar transistor has a higher transconductance than the unipolar transistor.

Example 7

The device of example 1, where the bipolar transistor comprises an insulated gate bipolar transistor.

Example 8

The device of example 1, where the unipolar transistor comprises a metal oxide semiconductor field effect transistor.

Example 9

The device of example 1, where the unipolar transistor comprises a silicon carbide-based transistor.

Example 10

The device of example 1 further includes a driver circuit, where the driver circuit is configured to increase a control voltage at least for the bipolar transistor in case of an overcurrent event.

Example 11

The device of example 10, where the gate driver circuit is configured to control both the unipolar transistor and the bipolar transistor.

Example 12

The device of example 10 further includes a further gate driver circuit configured to control the unipolar transistor.

Example 13

The device of example 10, where the driver circuit for switching off the transistor device is configured to switch off the unipolar transistor after switching off the bipolar transistor.

Example 14

The device of example 1, where at 20° C. the bipolar transistor has a higher blocking voltage than the unipolar transistor.

Example 15

A transistor device includes a unipolar transistor coupled between a first terminal and a second terminal, a bipolar transistor coupled in parallel to the unipolar transistor between the first and second terminals, and gate control circuitry, where the control circuitry is configured to switch the bipolar transistor on only upon detection of an overcurrent event.

Example 16

The device of example 15, where the bipolar transistor has a higher threshold voltage than the unipolar transistor.

Example 17

The device of example 16, where the gate driver circuitry includes a common control driver for the bipolar transistor and the unipolar transistor.

Example 18

The device of example 15, where the control circuitry includes separate control drivers for the bipolar transistor and the unipolar transistor.

Example 19

The device of example 15, where the control circuit is configured distinguish between a short circuit event and a surge current event and to switch on the bipolar transistor only if the overcurrent event is a surge current event.

Example 20

The device of example 1 further includes at least one of a freewheeling diode coupled between the first and second terminals or a silicon carbide diode coupled between the first and the second terminals.

In view of the many variations and alternatives described above it is clear that the above embodiments serve merely as illustrative examples and are not to be construed as limiting.

What is claimed is:

1. A transistor device comprising:
   a unipolar transistor coupled between a first terminal and a second terminal; and
   a bipolar transistor coupled in parallel to the unipolar transistor between the first terminal and the second terminal,
   wherein the bipolar transistor has a threshold voltage higher than a threshold voltage of the unipolar transistor,
   wherein a difference between the threshold voltage of the bipolar transistor and the threshold voltage of the unipolar transistor is at least 1 V, and
   wherein the bipolar transistor is configured to carry a majority of a current flowing through the transistor device, from the first terminal to the second terminal, when the current exceeds a predetermined threshold; and
   gate control circuitry configured to switch the bipolar transistor on only upon detection of an overcurrent event, wherein the gate control circuitry is configured to distinguish the overcurrent event between a short circuit event and a surge current event and to switch on the bipolar transistor only if the overcurrent event is a surge current event.

2. The transistor device of claim 1, wherein the higher threshold voltage of the bipolar transistor is about 8 V or more.

3. The transistor device of claim 1, wherein the difference between the threshold voltage of the bipolar transistor and the threshold voltage of the unipolar transistor is at least 3 V.

4. The transistor device of claim 1, wherein the difference between the threshold voltage of the bipolar transistor and the threshold voltage of the unipolar transistor is at least 5 V.

5. The transistor device of claim 1, wherein the unipolar transistor has a same nominal voltage as the bipolar transistor.

6. The transistor device of claim 1, wherein the bipolar transistor has a higher transconductance than the unipolar transistor.

7. The transistor device of claim 1, wherein the bipolar transistor is an insulated gate bipolar transistor.

8. The transistor device of claim 1, wherein the unipolar transistor is a metal oxide semiconductor field effect transistor.

9. The transistor device of claim 1, wherein the unipolar transistor is a silicon carbide-based transistor.

10. The transistor device of claim 1, wherein the gate control circuitry is configured to control both the unipolar transistor and the bipolar transistor.

11. The transistor device of claim 1, further comprising:
    a further gate driver circuit configured to control the unipolar transistor.

12. The transistor device of claim 1, wherein the gate control circuitry for switching off the transistor device is configured to switch off the unipolar transistor after switching off the bipolar transistor.

13. The transistor device of claim 1, wherein, at 20° C., the bipolar transistor has a higher blocking voltage than the unipolar transistor.

14. A transistor device, comprising:
    a unipolar transistor coupled between a first terminal and a second terminal;
    a bipolar transistor coupled in parallel to the unipolar transistor between the first terminal and the second terminal; and
    gate control circuitry, wherein the gate control circuitry is configured to switch the bipolar transistor on only upon detection of an overcurrent event, wherein the gate control circuitry is configured to distinguish the overcurrent event between a short circuit event and a surge current event and to switch on the bipolar transistor only if the overcurrent event is a surge current event.

15. The transistor device of claim 14, wherein the bipolar transistor has a higher threshold voltage than the unipolar transistor.

16. The transistor device of claim 15, wherein the gate control circuitry comprises a common control driver configured to control the bipolar transistor and the unipolar transistor.

17. The transistor device of claim 14, wherein the gate control circuitry comprises separate control drivers, including a first control driver and a second control driver, wherein the first control driver is configured to control the bipolar transistor and the second control driver is configured to control the unipolar transistor.

18. The transistor device of claim 14, further comprising:
    at least one of a freewheeling diode coupled between the first terminal and the second terminal or a silicon carbide diode coupled between the first terminal and the second terminal.

19. The transistor device of claim 1, wherein the gate control circuitry configured to measure a slope of the current in response to detecting the overcurrent event, and distinguish the overcurrent event between the short circuit event and the surge current event based on the measured slope.

20. The transistor device of claim 14, wherein the gate control circuitry configured to measure a slope of the current in response to detecting the overcurrent event, and distinguish the overcurrent event between the short circuit event and the surge current event based on the measured slope.

* * * * *